Feb. 24, 1970 J. PHILIPS 3,497,776

UNIFORM AVALANCHE-BREAKDOWN RECTIFIERS

Filed March 6, 1968

INVENTOR
John Philips
BY
C. L. Menzemer
ATTORNEY 3,497,776

UNIFORM AVALANCHE-BREAKDOWN RECTIFIERS

John Philips, Monroeville, Pa., assignor to Westinghouse Electric Corporation, Pittsburgh, Pa., a corporation of Pennsylvania Filed Mar. 6, 1968, Ser. No. 710,852
Int. Cl. H01l 3/00, 5/00, 9/00
U.S. Cl. 317—234 4 Claims

ABSTRACT OF THE DISCLOSURE

This disclosure sets forth a junction rectifier semiconductor device which has an impurity distribution such that the avalanche-breakdown voltage is higher at the periphery of the device than in the interior and thus the device has more uniform avalanche-breakdown properties.

BACKGROUND OF THE INVENTION

This invention is concerned with a junction type rectifier semiconductor device.

It is important in the design and operation of circuits using silicon rectifiers to make sure that voltage transients exceeding the avalanche-breakdown of the junction are not impressed on the rectifier. Even a momentary excess voltage spike can destroy or damage the rectifier. In order to prevent this damage, additional circuit components may be required to prevent voltage spikes, or "surge suppressors" and other overload protective devices may be placed in parallel with the rectifier to dissipate the energy of the voltage transients.

The avalanche-breakdown process occurs in reverse-biased silicon p-n junctions when a critical electric field is reached in the space charge region. This field accelerates electrons and holes to sufficient energies to create hole-electron pairs by collision with valence electrons. These, in turn, are accelerated and a chain-reaction type of process proceeds and very high currents may flow in very localized areas with subsequent generation of heat. If the breakdown is uniform over the entire device area relatively large amounts of heat can be dissipated by the device without destroying it. Such devices may then act as their own "surge suppressors" and the additional circuit components may not be needed for many applications.

However, it is believed that most common types of silicon rectifiers, alloyed and diffused, especially high-voltage types, are particularly vulnerable to premature avalanche-breakdown at the edge of the p-n junction where it is in contact with the outside environment. During a voltage transient, the edge, or small part of the edge, may tend to breakdown at a much lower voltage than the main area of the p-n junction. Therefore, the peak inverse voltage of the rectifier is reduced and more important, the high leakage current flowing through the small edge area may overheat and damage the rectifier. In order to have a rectifier with a "built-in" voltage overload protection, the edge breakdown must be eliminated to permit bulk breakdown to occur simultaneously over most of the p-n junction area.

One means of lowering the electrical field at the perimeter of a normally diffused p-n junction rectifier has been by shaping the edges of the device which are intersected by the p-n junction.

By shaping this interface, the breakdown voltage at the edge can be increased and uniform avalancing over the entire rectifier area takes place. Manufacturing methods can be devised to make such an angular interface, but in many instances etched rectifiers automatically have an angular junction interface and do not always possess uniform body breakdown properties, especially at voltages about 1000 volts. Etching and other similar junction treatment techniques are not satisfactory. Also, common planar type rectifiers have perfectly perpendicular interfaces inherent to the oxide-masking technique and the above method cannot be used.

An object of this invention is to provide a junction-type rectifier semiconductor device in which avalanche-breakdown is made uniform by controlling the doping impurity distribution.

Other objects will, in part, be obvious and will, in part, appear hereinafter.

SUMMARY OF THE INVENTION

This invention provides a semiconductor device of the junction rectifier type comprising a body of semiconductor material, said body having to pand bottom surfaces which are substantially parallel, a first region, said first region having a first-type of semiconductivity, said first region containing a relatively high concentration of doping impurity, said first region extending from the top surface of the body to a point within the body, which point is substantially less than the thickness of the body, the area of said first region exposed at the top surface of the body being less than the area of the top surface of the body, a second region, said second region having said first-type of semiconductivity, said second region containing a lesser concentration of doping impurity than said first region, said second region extending from the top surface of the body to a point within the body, said point being substantially less than the thickness of the body, said second region extending further into said body than said first region, said second region being disposed about and in contact with the periphery of said first region, the area of said second region exposed at the top surface of the body being less than the area of the first region, and the combined areas of the first and second regions exposed at the top surface of the body being less than the area of the top surface of the body, a third region, said third region having a second-type of semiconductivity, said third region containing a relatively high concentration of doping impurity, said third region being coextensive with the bottom surface of said body and extending from said bottom surface to a point within said body, said point being less than the thickness of the body and being spaced from the first and second regions, a fourth region, said fourth region having said second-type of semiconductivity, said fourth region containing a less concentration of doping impurity than said third region, said fourth region extending from said third region to said first and second regions and to the top surface of the body, a p-n junction between said fourth and said first region, a p-n junction between said fourth and said second region, and electrical contacts affixed to said first and to said third regions.

DESCRIPTION OF THE DRAWINGS

For a better understanding of the nature and objects of the invention, reference should be had to the following detailed description and drawing, in which.

DESCRIPTION OF THE PREFERRED EMBODIMENT

Figure 1:
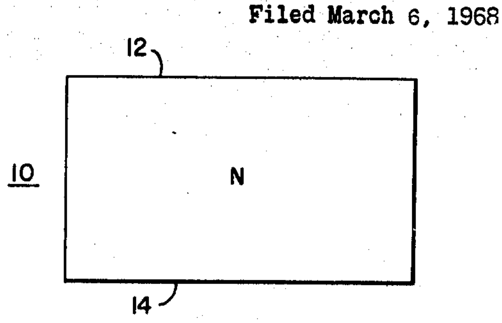
FIGURE 1 is a side view of a body of semiconductor material suitable for use in accordance with the teachings of this invention.

With reference to FIG. 1, there is shown a body 10 of a semiconductor material suitable for use in accordance with the teachings of this invention. The body 10 has a top surface 12 and a bottom surface 14. The surfaces 12 and 14 are substantially parallel.

The body 10 may be any semiconductor material known to the art, as for example, silicon, germanium, silicon carbide, stoichiometric compounds consisting of a Group III and a Group VI element of the periodic chart and stoichiometric compounds of a Group II and Group VI element of the periodic chart. Silicon is currently the most widely used material.

There are several fabrication processes which may be used to make the rectifier device of this invention with the required impurity distribution. The simplest one is the diffusion-planar technique.

Accordingly, for the purpose of explanation the device will be described in terms of preparing it from silicon by the diffusion-planar technique. It should be understood, of course, that other semiconductor materials can be used and that the device can be prepared by other techniques.

In accordance with the selected example, the body 10 will be considered to be a circular body of n-type silicon doped to a concentration of from $10^{12}$ to $10^{17}$ atoms per cc. of silicon.

Figure 2:
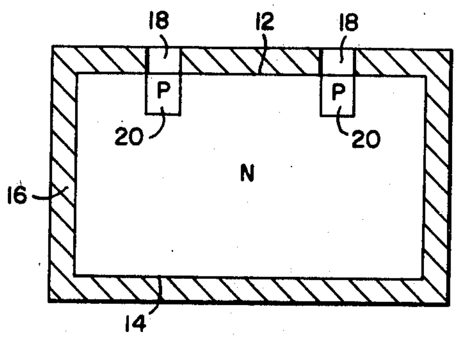
FIGS. 2 and 3 are side views, partially in section, of the body of FIG. 1 being processed in accordance with the teachings of this invention.

With reference to FIG. 2, the body 10 is oxidized to form a layer 16 of silicon dioxide on its surfaces. Satisfactory results have been achieved when the layer 16 is grown to a thickness of from 15,000 to 20,000 angstroms.

A ring shaped window 18 is etched into that part of layer 16 disposed on top surface 12 of the body 10. The window 18 may be formed by the photoresist or any other technique known to those skilled in the art.

Aluminum, or any other suitable p-type dopant, is then diffused into the body 10 only through the window 18 to form a p-type region 20. The p-type region 20 should be doped to a concentration of from $10^{14}$ to $10^{17}$ atoms of dopant per cc. of silicon. If the body 10 has a thickness of 10 mils, region 20 should have a depth of about 1.0 to 1.5 mils. The region 20 should have a doping concentration of about one order of magnitude greater than the body 10. For example if the body 10 has a doping concentration of $10^{17}$ atoms of dopant per cc. of silicon, region 20 should be doped to a concentration of at least $10^{18}$ atoms of dopant per cc. of silicon.

The diffusion can be carried out satisfactorily in a closed-tube furnace with a surface concentration of aluminum of about $2\times10^{16}/\text{cm.}^3$.

Figure 3:
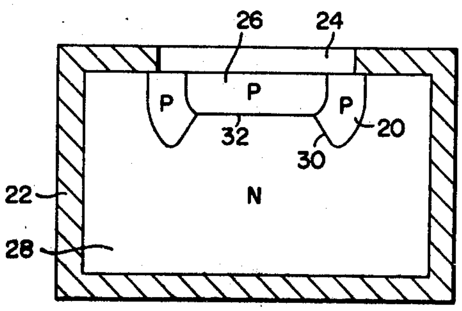

With reference to FIG. 3, a new layer 22 of silicon dioxide is formed on the surfaces of the body 10 and a window 24 is opened in the layer 22 in the central area of the top surface 12 of the body 10.

Boron, or any other suitable p-type dopant, is then diffused into the body 10 only through the window 24 to form a p-type region 26. The p-type region 26 should be doped to a concentration of from $10^{18}$ to $10^{21}$ atoms of dopant per cc. of silicon. Assuming again that the body 10 has a thickness of 10 mils, region 26 should have a depth of about 1.0 to 1.5 mils.

The boron diffusion can be carried out successfully in a closed tube-type furnace with a surface concentration of boron of about $10^{20}/\text{cm.}^3$.

The boron diffusion causes the aluminum dopant forming p-type region 20 to be driven deeper into n-type region 28. This driving of the aluminum dopant deeper into the n-type region 28 forms a more graded p-n junction 30 between p-type region 20 and n-type region 28 than p-n junction 32 between p-type region 26 and n-type region 28.

Since the boron cannot overtake the previously diffused aluminum front, the edge p-n junction 30 between regions 20 and 28 remains a very shallow net impurity concentration gradient having a value of about $10^{17}$ atoms per cm.$^4$, while the center or interior area p-n junction 32 between regions 26 and 28 has a much steeper net impurity concentration gradient, about $10^{18}$ atoms per cm.$^4$, and thus a lower avalanche-breakdown voltage than p-n junction 30.

It is important in the device of this invention that the central p-n junction net impurity atom concentration gradient exceed the edge p-n junction net impurity atom concentration gradient by at least one order of magnitude.

Figure 4:
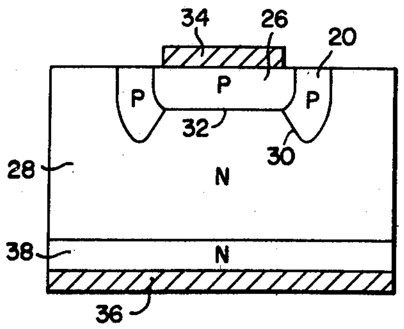
FIG. 4 is a side view, partially in section, of a semiconductor device prepared in accordance with the teachings of this invention.

With reference to FIG. 4, an electrical contact 34 is alloyed to p-type region 26. The contact 34 should consist of a p-type dopant metal as for example boron or an alloy of a p-type dopant and a carrier metal such for example silver. A suitable alloy would be a silver-boron alloy. The use of a p-type dopant metal to form the contact assures good electrical characteristics at the p-type region-contact interface.

Another electrical contact 36 is formed on bottom surface 14 of the body 10 by alloying an n-type dopant metal, as for example antimony, or an alloy of an n-type dopant metal and a carrier metal, as for example silver to the body 10 through the surface 14. A suitable alloy would be a silver-antimony alloy.

The alloying of the contact 36 to bottom surface 14 also results in the formation of a region 38. Since an n-type dopant is employed and region 28 is already n-type, the newly formed region 38 is n-type with a higher dopant concentration than region 28. The dopant concentration region 38 ranges from $10^{18}$ to $10^{21}$ atoms of dopant per cubic centimeter of silicon.

The device of FIG. 4 is a rectifier with a uniform avalanche-breakdown characteristic.

In the device of FIG. 4, region 28 is a lightly doped, $10^{12}$ to $10^{17}$, n-type region. Region 20 is a very lightly doped, $10^{14}$ to $10^{17}$, p-type region which surrounds region 26. The p-n junction 30 between regions 20 and 28 has a very shallow gradient, about $10^{17}$ atoms per cm.$^4$. Region 26 is a very highly doped, $10^{18}$ to $10^{21}$, p-type region to which contact 34 is affixed, and region 26 with region 28 forms the bulk of the rectifier area. The p-n junction 32, between regions 26 and 28 has a much steeper gradient, $10^{18}$ atoms per cm.$^4$, that p-n junction 30 between regions 20 and 28. Region 38 is a highly doped, $10^{18}$ to $10^{21}$, n-type region which is needed for contacting purposes.

When an increasing reverse voltage is applied between regions 26 and 28, junction 32 will avalanche-breakdown first since the electrical field is higher at this junction than at junction 30 between regions 20 and 26.

Therefore, such a rectifier as shown in FIG. 4 will have a uniform body breakdown in the larger central region because the junction at the edge has not yet reached its higher avalanche voltage.

While the invention has been described with reference to particular embodiments and examples, it will be understood, of course, that modifications, substitutions and the like may be made therein without departing from its scope.

I claim as my invention:

1. A rectifier comprising, a body of semiconductor material, said body having top and bottom surfaces which are substantially parallel, a first region, said first region having a first-type of semiconductivity, said first region containing a relatively high concentration of doping impurity, said first region extending from the top surface of the body to a point within the body which point is substantially less than the thickness of the body, the area of said first region exposed at the top surface of the body being less than the area of the top surface of the body, a second region, said second region having said first-type of semi-conductivity, said second region containing a relatively lesser concentration of doping impurities than said first region, said second region extending from the top surface of the body to a point within the body, said point being substantially less than the thickness of the body, said second region extending further into said body than said first region, said second region being disposed about and in contact with the periphery of said first-region, the area of said second region exposed at the top surface of the body being less than the area of the first region and the combined areas of the first and second regions exposed at the top surface of the body being less than the area of the top surface of the body, a third region, said third region having a second-type of semiconductivity, said third region containing a relatively high concentration of doping impurity, said third region being coextensive with the bottom surface of said body and extends from said bottom surface to a point within said body, said point being less than the thickness of the body and being spaced from the first and second regions, a fourth region, said fourth region having said second-type of semiconductivity, said fourth region containing a relatively lesser concentration of doping impurity than said third region, said fourth region extending from said third region to said first and second regions and to the top surface of the body, a p-n junction between said fourth region and said first region, a p-n junction between said fourth region and said second region and electrical contacts affixed to said first and said third regions.

2. The device of claim 1 in which the first region has doping concentration of from $10^{18}$ to $10^{21}$ atoms per cubic centimeter of semiconductor material, the second region has a doping concentration of from $10^{14}$ to $10^{17}$, the third region has a doping concentration of from $10^{18}$ to $10^{21}$ and the fourth region has a doping concentration of from $10^{12}$ to$10^{17}$.

3. The device of claim 2 in which the p-n junction between the first and fourth regions has a net impurity atom concentration gradient at least one order of magnitude greater than the p-n junction between the second and fourth regions.

4. The device of claim 3 in which the p-n junction between the first and fourth regions has a net impurity atom concentration gradient of about $10^{18}$ atoms per cm.$^4$ and the p-n junction between the second and fourth regions has a net impurity atom concentration gradient of about $10^{17}$ atoms per cm.$^4$.

References Cited

UNITED STATES PATENTS

| | | | |
|---|---|---|---|
| 3,056,888 | 10/1962 | Atalla | 317—235 X |
| 3,183,128 | 5/1965 | Leistiko et al. | 317—235 X |
| 3,333,115 | 7/1967 | Kawakami | 317—235 X |
| 3,432,920 | 3/1969 | Rosenzweig | 317—235 X |

JAMES D. KALLAM, Primary Examiner

U.S. Cl. X.R.

317—235